(12) United States Patent
Borning et al.

(10) Patent No.: US 8,485,566 B2
(45) Date of Patent: Jul. 16, 2013

(54) DOOR WITH MOUNT AND LOCK STRUCTURES FOR MISSION CRITICAL ENCLOSURES

(75) Inventors: Jeffrey M. Borning, Rosemount, MN (US); Scott M. Ralston, Farmington, MN (US); David J. Shelander, St. Paul, MN (US); Nathan E. Stremick, Newport, MN (US); John A. Holst, Prescott, WI (US)

(73) Assignee: Lockheed Martin Corporation, Bethesda, MD (US)

( * ) Notice: Subject to any disclaimer, the term of this patent is extended or adjusted under 35 U.S.C. 154(b) by 973 days.

(21) Appl. No.: 12/496,403

(22) Filed: Jul. 1, 2009

(65) Prior Publication Data

US 2011/0001411 A1 Jan. 6, 2011

(51) Int. Cl.
*E05C 1/02* (2006.01)

(52) U.S. Cl.
USPC .......................................................... 292/137

(58) Field of Classification Search
USPC ................ 292/137, 138, 139, 140, 143, 145, 292/1, 340, 342, DIG. 19, DIG. 39, DIG. 40, 292/DIG. 41, DIG. 54, DIG. 55, DIG. 68; 49/501, 503, 394, 395, 397, 400, 401, 402, 49/427, 478.1; 312/296, 223.1, 326, 329
See application file for complete search history.

(56) References Cited

U.S. PATENT DOCUMENTS

| | | | | |
|---|---|---|---|---|
| 1,192,733 A | * | 7/1916 | Bennett | 292/175 |
| 1,654,163 A | * | 12/1927 | Evans | 292/300 |
| 2,526,539 A | * | 10/1950 | Carroll | 292/17 |
| 3,261,628 A | * | 7/1966 | Kesling | 292/70 |
| 3,603,631 A | * | 9/1971 | White | 292/220 |
| 3,733,749 A | * | 5/1973 | Parera | 49/193 |
| 4,203,622 A | * | 5/1980 | Cook et al. | 292/221 |
| 4,305,611 A | * | 12/1981 | Robins | 292/238 |
| 4,435,027 A | * | 3/1984 | Prather et al. | 312/222 |
| 5,120,087 A | * | 6/1992 | Pastva | 292/22 |
| 5,713,647 A | * | 2/1998 | Kim | 312/223.2 |
| 5,853,238 A | * | 12/1998 | Cullen et al. | 312/304 |

(Continued)

FOREIGN PATENT DOCUMENTS

DE 202 17 454 3/2003

OTHER PUBLICATIONS

International Search Report for international application No. PCT/US2010/039953, dated Dec. 23, 2010 (4 pages).
Written Opinion of the International Searching Authority for international application No. PCT/US2010/039953, dated Dec. 23, 2010 (6 pages).

*Primary Examiner* — Thomas Beach
*Assistant Examiner* — Nathan Cumar
(74) *Attorney, Agent, or Firm* — Hamre, Schumann, Mueller & Larson, P.C.

(57) ABSTRACT

A door for mission critical enclosures, for example, cabinets containing sensitive items, such as electronics that may be exposed to high stress environments, for example shock and vibration. The door structure described provides improved mounting and lock features that can allow easy access while maintaining rigid structural needs and integrity. A door assembly for a cabinet generally includes a door that can be fitted directly, or indirectly, to an enclosure through an adapter frame. Generally, the door has fitting structures that operate as interlocking, tight fitting key sets. The fittings provide suitable detent features. An actuatable lock mechanism respectively locks and unlocks the door. The actuatable lock mechanism includes a ramped locking bolt that can engage a ramped surface of the cabinet or adapter frame to facilitate locking and unlocking of the door.

15 Claims, 14 Drawing Sheets

U.S. PATENT DOCUMENTS

| | | |
|---|---|---|
| 6,039,364 A | 3/2000 | Rieger et al. |
| 6,297,948 B1 * | 10/2001 | Buican et al. ............ 361/679.58 |
| 6,775,137 B2 * | 8/2004 | Chu et al. ...................... 361/696 |
| 2008/0148642 A1 * | 6/2008 | Mathieu ......................... 49/395 |
| 2011/0001411 A1 * | 1/2011 | Borning et al. ............... 312/326 |

* cited by examiner

DOOR WITH MOUNT AND LOCK STRUCTURES FOR MISSION CRITICAL ENCLOSURES

FIELD

This disclosure generally pertains to the field of mission critical enclosures, for example, enclosures that may be exposed to high stress environments. More particularly, the disclosure herein relates to an improved door structure, with mounting and lock features, for such mission critical enclosures.

BACKGROUND

Enclosures used, for example, under conditions of extreme structural stress and environments such as shock and vibration, are widely known and often include a certain door that can withstand such extreme conditions. One particular application for such doors is for use with electronic enclosures, for example, in military environments such as the Navy or other mission or event critical situations. To withstand such conditions, some doors have been constructed with a twenty-four bolt structure to connect to and close an enclosure, such as a cabinet.

Still, improvements are needed for such doors, for example to improve their overall accessibility and assembly.

SUMMARY

Generally, a door is described that can be used on mission critical enclosures, for example, cabinets containing sensitive items, such as electronics that may be exposed to high stress environments, for example shock and vibration. The door structure described provides improved mounting and lock features that allow easy access while maintaining structural needs and integrity. A door assembly for a cabinet generally includes a door that can be fitted directly or, in some cases, indirectly to an enclosure through an adapter frame.

In some embodiments, the door includes a fitting structure with suitable detent features. For example, a vertical detent and a horizontal detent are configured to prevent vertical and horizontal movement of the door when the door is fitted to the cabinet, or indirectly fitted to the cabinet through an adapter frame. The vertical and horizontal detents act as key sets that can abut with respective vertical and horizontal detents on the cabinet or on an adapter frame if one is used.

An actuatable lock mechanism respectively locks and unlocks the door. In some embodiments, the actuatable lock mechanism includes a ramped locking bolt that can engage a ramped surface of the cabinet or the adapter frame to facilitate locking and unlocking of the door.

In some embodiments the actuatable lock mechanism and can be actuated by a one-handed single latch handle.

Generally, the door concepts herein can allow for quick and convenient accessibility to open and close the door, for example in about ten second or even less, while offering an overall ease of assembly. The door assembly described herein can be available for new cabinet builds or, in other cases, can be used to replace an existing door, such as those known twenty-four bolt doors, through use of the adapter frame that can allow for a backfittable, field installable door assembly. The door assembly herein is structurally qualified, and includes for example suitable electromagnetic interference (EMI) seals and/or suitable environmental seals to prevent fluid ingress (e.g. from water).

As some examples, the door may be used with electronic enclosures, for example in military operations such as the Navy, but can be used for any enclosure that may need protection against extreme environmental events, such as shock and vibration. The door herein also can be used with enclosures that contain items other than electronics.

DETAILED DESCRIPTION

FIGS. 1-14 show various features of a door assembly 10 that can be used on mission critical enclosures, for example, cabinets containing sensitive items, such as electronics that may be exposed to high stress environments, for example shock and vibration. Generally, the door assembly 10 described provides improved mounting and lock features that allow easy access and assembly while maintaining structural needs and integrity. The door assembly 10 for a cabinet generally includes a door 12 that can be fitted directly or, in some cases, indirectly to an enclosure through an adapter frame 20. The door assembly 10 described herein can be available for new cabinet builds or, in other cases, can be used to replace an existing door, such as those known twenty-four bolt doors, through use of the adapter frame 10, so as to allow for a backfittable, field installable door assembly.

As some examples, the door assembly 10 may be used with electronic enclosures, including for example military operations and equipment transport such as the Navy, but can be used for any enclosure that may need protection and security against extreme environmental events, such as shock and vibration, or for any enclosure where the features herein are desired. It also will be appreciated that the door herein also can be used with enclosures that contain items other than electronics.

Figure 1:
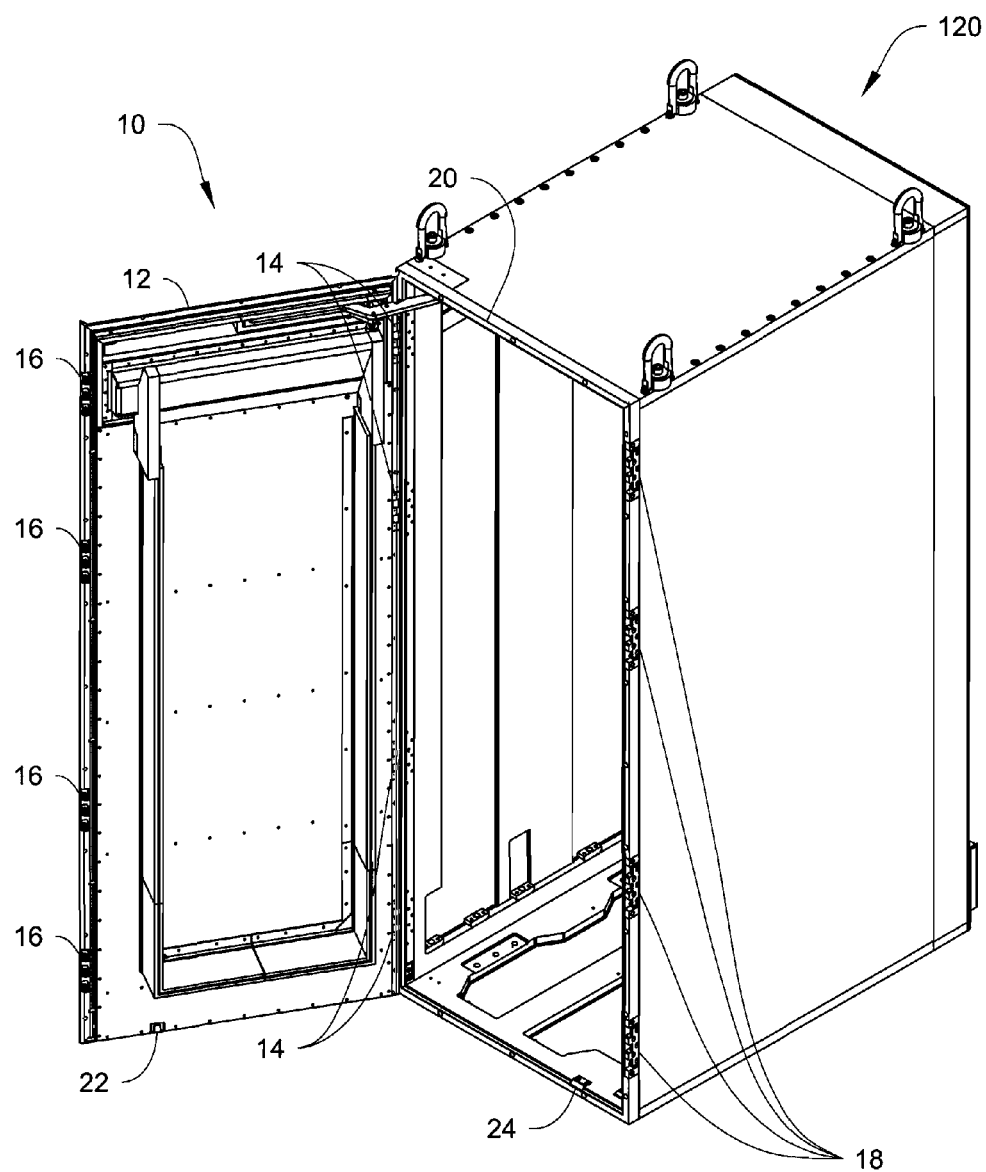
FIG. 1 shows a perspective view of one embodiment of a door assembly connected to an enclosure in a generally open position.

With reference to FIG. 1, the door assembly 10 is for an enclosure 120, which resembles a cabinet-like structure. Generally, the door assembly includes a door 12, a door-side hinge part 46 at hinge 14 (best shown in FIG. 4 and further described below) connected to a side of the door 12. The door-side hinge part 46 is configured for pivotable attachment directly or indirectly to the cabinet 120. A door fitting 16 is connected to a side opposite the door-side hinge part 46. The door fitting 16 is configured to directly or indirectly fit the door to the cabinet 120. The door fitting 16 includes a vertical detent 60 and horizontal detent 74 configured to prevent vertical and horizontal movement of the door 12 when the door 12 is to befitted to the cabinet 120 (door fitting 16 best shown in FIGS. 6 and 7 and further described below). The door assembly 12 also includes an actuatable lock mechanism that respectively puts the door into lock and unlock positions (best shown in FIGS. 8-14 further described below).

It will be appreciated that the door 12 can be fitted directly or, in some cases, indirectly to the enclosure 120 through an adapter frame 20, as a component for e.g. backfittable applications. For example, the door 12 can be directly fitted to the cabinet 120, such as when the cabinet 120 is a new build that includes the fitting and mating features. For ease of description hereafter, such fitting and mating features will be discussed with respect to the adapter frame 20, while understanding that an adapter frame (e.g. adapter frame 20) may not be necessary for such new cabinet builds that do not need an adapter frame as a backfittable component. One of skill in the art could construct such new cabinet builds with the fitting and mating features described herein, for example on outer frame structures at the opening of the cabinet. When the adapter frame 20 is used as a separate connectable component, the frame 20 can offer an additional benefit of a "failure tolerant" design. For example, if any part of the door handle/latch mechanism (further described below) should break in the field locking the cabinet shut, the door 12 can still be removed via detachment of the adapter frame 20, allowing cabinet access.

Figure 2:
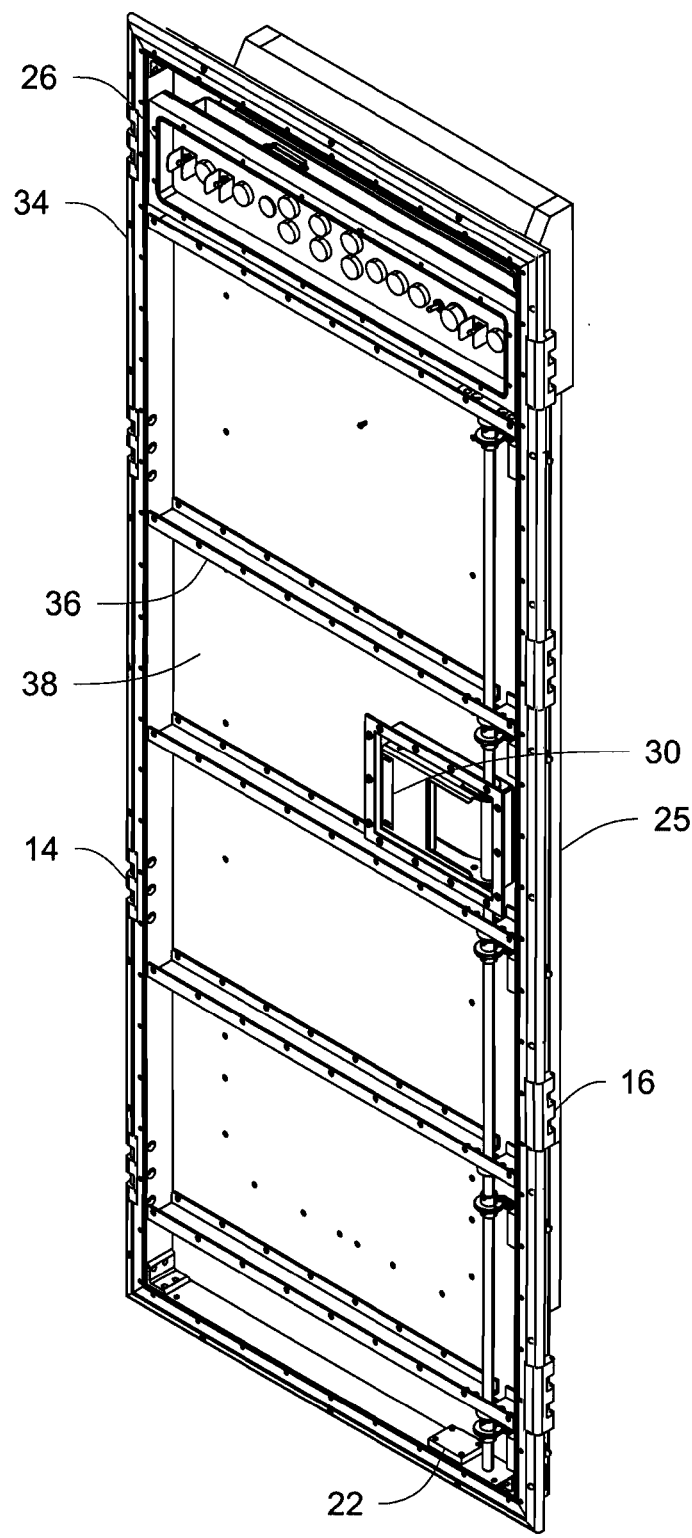
FIG. 2 shows a perspective view of the door assembly of FIG. 1 separate from the enclosure and with outer panels removed.
Figure 3:
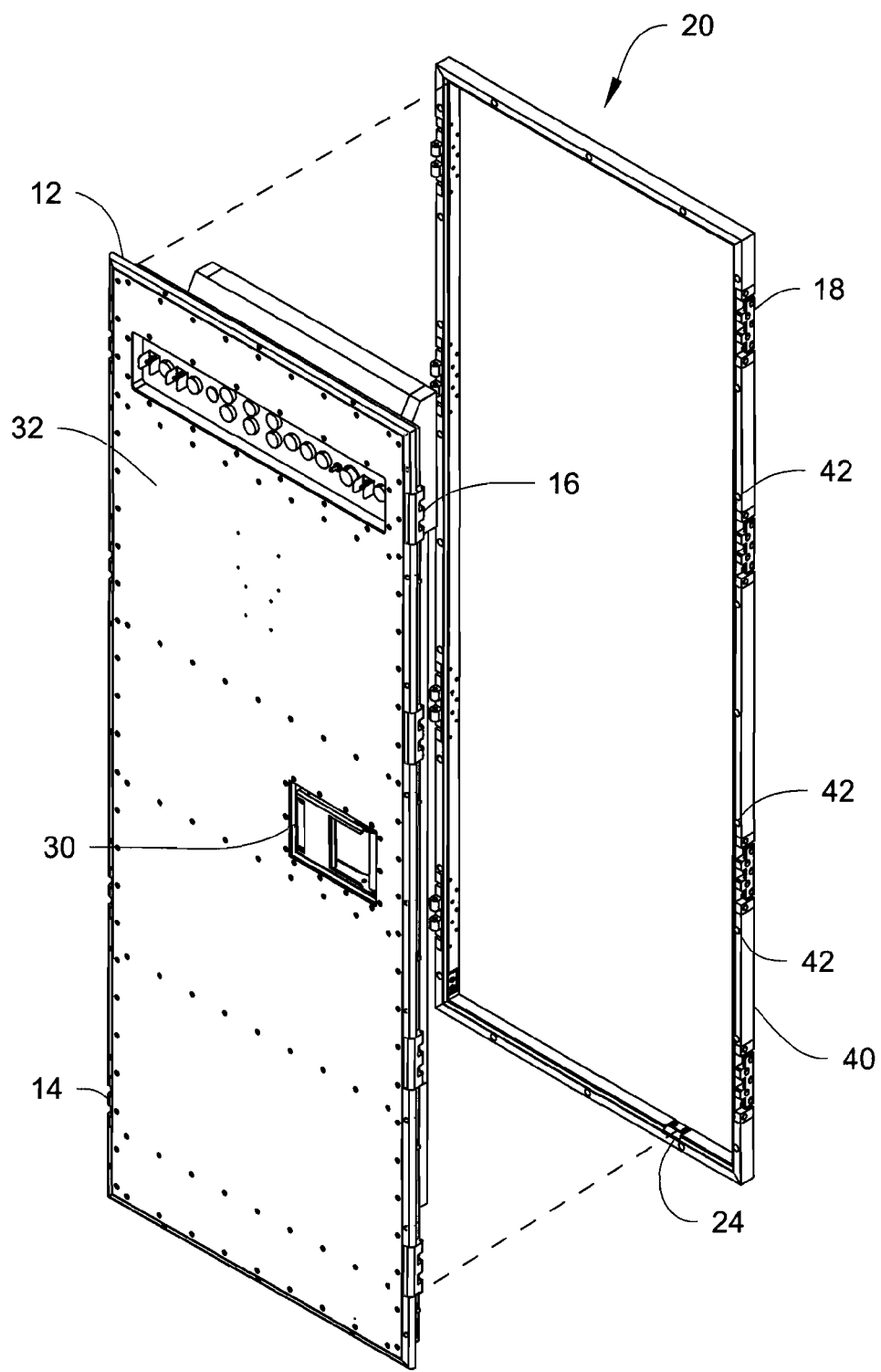
FIG. 3 shows an exploded view of the door assembly of FIG. 1 and one embodiment of an adapter frame for the assembly.

With further reference to the door 12, FIGS. 2 and 3 show one embodiment for details of the door 12. In the embodiment shown, the door 12 includes outer frame members 34. As shown, the outer frame members 34 of the door 12 are formed or arranged as a generally tall rectangle. At least one cross brace is connected to the outer frame members 34 between sides of the outer frame members 34. It will be appreciated that multiple cross braces 36 may be employed and in various arrangements that are not limited to the embodiment shown. Outer 32 and inner panels 38 cover at least the cross braces 36. It will be appreciated that the door 12 will include any necessary gussets and supports for the structural rigidity that may be needed. In some examples, the structural components of the door 12 may be designed as extruded aluminum and/or various sheet metal parts.

As further shown in FIGS. 2 and 3, the adapter frame 20 has an outer frame construction 40 arranged as a perimeter with an inner edge defining a generally open area. The adapter frame 20 generally is constructed and arranged to directly connect to the door 12 through a hinge 14 and fitting structure 16, 18. The adapter frame 20 also includes fastener receivers 42, which may be bolt holes through the adapter frame 20. The fastener receivers 42 are configured to receive fasteners to directly connect the adapter frame 20 to the cabinet 120, such as through bolts and screws (see e.g. bolt 50 of FIG. 5).

In some embodiments, such as for retrofit applications, the adapter frame 20 is used to apply the door 12 to the cabinet 120. The door 12 is hinged to the adapter frame 20. With the fastener receivers 42, the adapter frame 20 can be directly attached to the cabinet 120, for example using the original threaded inserts on an existing cabinet used to connect known doors (e.g. can use same bolt hole configuration as in known twenty four bolt doors).

In some embodiments, the door 12 and adapter frame 20 is approximately 2 inches thick, which may add about 1.1 inches to some known door thicknesses (known door e.g. 0.9 inches).

With further reference to the example of backfitting applications, various components of an 'old' existing door can be reused, and reuse may be encouraged in some instances. Such components include for example, but are not limited to air baffle structures 25 like foams or brushes (e.g. for sound and vibration control), as well as electronic control panels 26. These components are well known and are not further described.

With reference to door 12 to adapter frame 20 assembly, alignment of the door 12 to the adapter frame 20 can be facilitated using various structures, other than the hinge 14 and fitting 16, 18 connections. In some embodiments, alignment can be facilitated by a ball bearing roller 22 and receiving ramp 24. In the embodiment shown, the ball bearing roller 22 is contained on the door 12, for example at the lower part of frame. The receiving ramp 24 is contained on the adapter frame 20, for example at a lower part of the adapter frame 20 that would correspond to the ball bearing position. The roller 22 and receiving ramp can allow precise alignment of the features of the interlocking key set (described in detail below) before engagement. Alignment initially is accomplished by adjusting the hinge location and facilitated its locking screws. Over time, however, wear and tear can compromise the precise alignment if only the hinges are relied upon. The roller 22 moving up the receiving ramp 24 helps to lift up the door to the a level that allows the interlocking key sets to precisely meet, since their clearance is minimal which is required to maintain limited movement of the door 12 relative to the adapter frame 20.

With reference to installation of the assembly, in a backfittable installation and/or reassembly, both the door 12 and adapter frame 20 in some embodiments are first fitted and aligned before attachment to the cabinet 120. That is, the door 12 and adapter frame 20 can be attached to the cabinet 120 as a single unit, which can provide some ease and convenience during the installation. It will be appreciated that the door 12 and adapter frame 20 could be installed separately and without any negative impact of its function.

Figure 4:
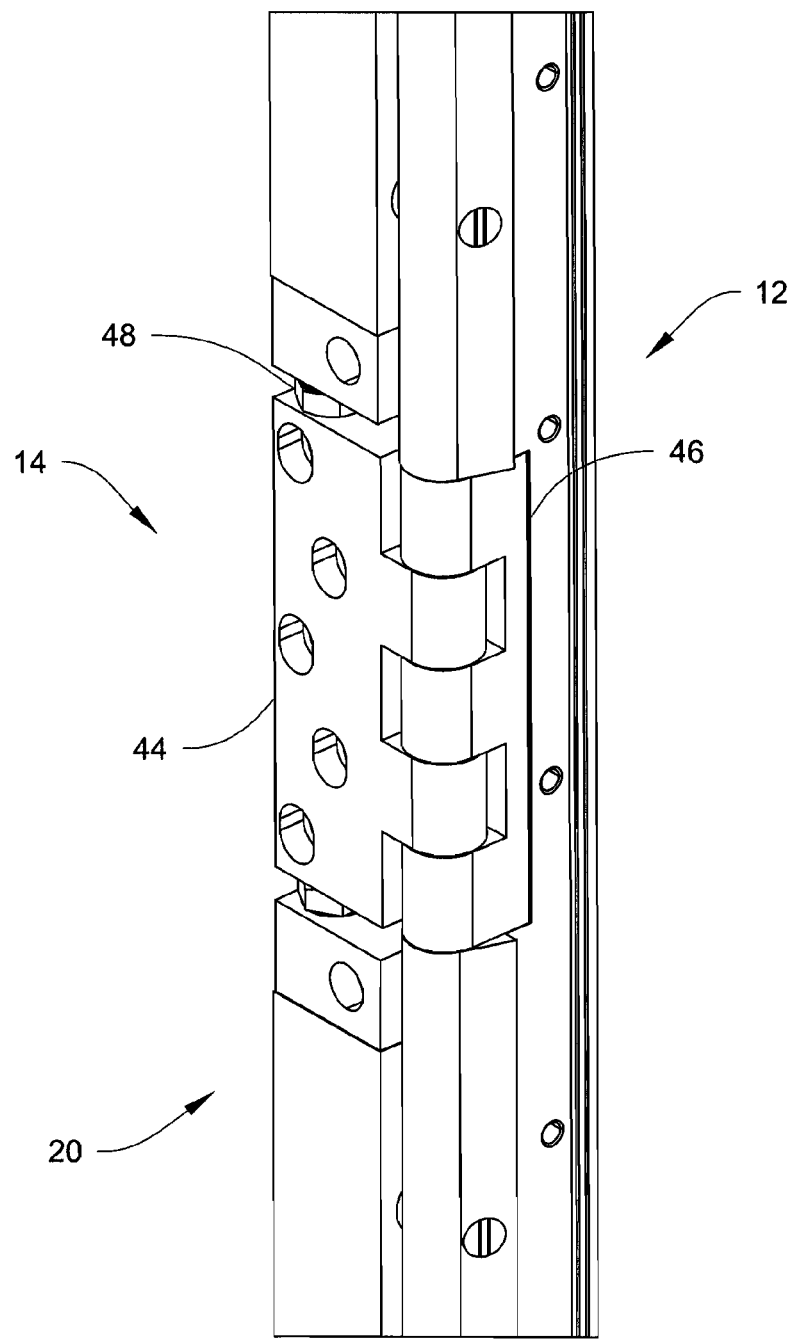
FIG. 4 shows a close up perspective view of one embodiment of a hinge for the door assembly of FIG. 1.
Figure 5:
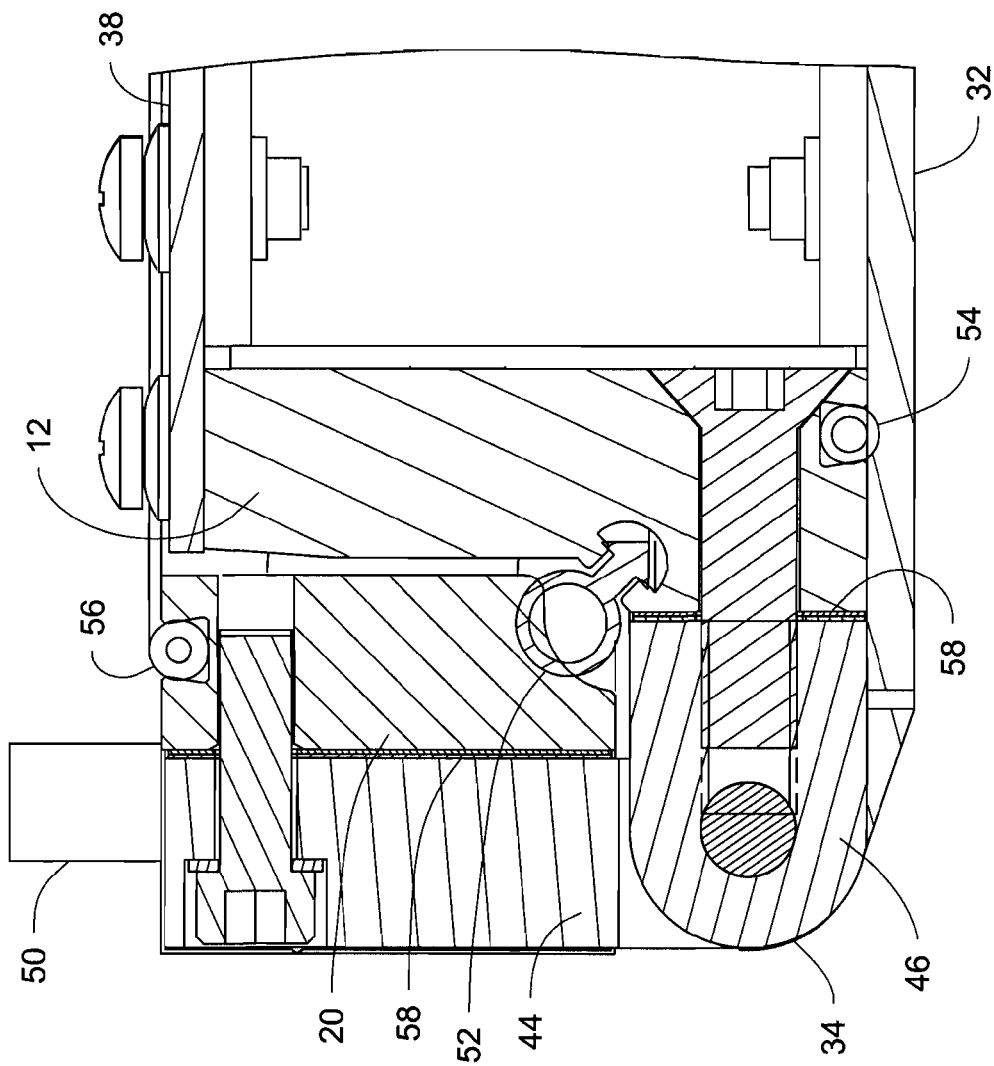
FIG. 5 shows a sectional view of the hinge of FIG. 4.

With further reference to the hinge 14, FIGS. 4 and 5 show an embodiment of specific components of the hinge 14. Generally, the hinge 14 includes the door-side hinge part 46 connected to a side of the door 12. The door-side hinge part 46 is configured for pivotable attachment to the adapter frame 20. A cabinet-side hinge part 44 is connected to a side of the adapter frame 20 that corresponds with the side of the door 12 that the door-side hinge part 46 is connected. As shown, the cabinet-side hinge part 44 is configured for pivotable attachment directly with the door-side hinge part 46. In some embodiments, a locking screw 48 may be incorporated with the cabinet-side hinge part 46, for example at the top and bottom. The locking screws 48 can prevent the unwanted movement of the hinge 14 from vibration and shock after being adjusted and aligned. The locking screws 48 also can be rotated to move the door 12 into better engagement with adapter frame 20. The locking screw 48 allows for vertical adjustment, alignment, and general fine-tuning of the hinge 14 during assembly.

With further reference to FIG. 5, an example of the internal structure of the area proximate the hinge 14 is shown. The adapter frame 20 uses bolts 50 to bolt to fastener receivers 42 so as to connect the adapter frame 20 to the cabinet 120 (cabinet 120 not shown in FIG. 5). As shown, the hinge 14 supports load from all directions, operates as a standard hinge as known in the art. As further shown, various seals 52, 54, and 56 are employed at all interfaces. While only portions of the seals are shown, it will be appreciated that the seals will extend about the perimeter of the door assembly, as needed and in their respective positions, so as to properly seal the intended interface. As shown, seal 52 seals the door 12 to the adapter frame 20. Seal 54 seals the outer panel 32 to the frame 34 of the door 12. Seal 56 seals the adapter frame 20 to the cabinet 120. Generally, the door assembly herein is structurally qualified, and includes for example both suitable electromagnetic interference (EMI) seals and suitable environmental seals to prevent fluid ingress (e.g. from water). As one example, the seal construction is a combination of both electromagnetic interference (EMI) and water (fluid) gasket seals for the adapter frame gasket (e.g. 56), the front panel gasket (e.g. 54), and the door gasket (e.g. 52). As shown the seals 52, 54, and 56 are hollow compression seals. As one example of EMI seals, seals by Vanguard are known EMI seals. It will be appreciated that other seal constructions and combinations also may be employed if appropriate and may depend upon the application for which the door assembly is intended.

With further reference to the fitting structure 16, 18 between the door 12 and the adapter frame 20, FIGS. 6, 6A-D, and 7 show one embodiment of features for the door fitting 16 and an adapter fitting 18. Generally, the fitting structure 16, 18 operates as an interlocking, tight fitting key set. Generally, the fitting structure provides suitable detent features. In the embodiment shown, the door fitting 16 includes a vertical detent 60 and a horizontal detent 74.

It will be appreciated, however, that the fitting structure is not limited to specific orientations and geometries, such as vertical and horizontal, and may include other orientations or geometries such as, but not limited to, various angular or dovetailed and/or curved geometries. It further will be appreciated that the door assembly may include fittings or keysets disposed at other locations of the door assembly, such as on top and bottom edges of the door assembly.

With further reference to the fitting structure 16, 18, the door fitting 16 is connected to a side opposite the door-side hinge part 44. Adapter fitting 18 is on a side of the adapter frame 20 that corresponds with the side of the door 12 that the door fitting 16 is connected. The adapter fitting 18 includes a vertical detent 68 and a horizontal detent 72.

With further reference to the fitting structure engagement, in the embodiment shown, the vertical detent 68 of the adapter fitting 18 is abuttable with the vertical detent 60 of the door fitting 16 at a space 64 adjacent the vertical detent 60. Likewise, the vertical detent 60 of the door fitting 16 is abuttable with the vertical detent 68 of the adapter fitting 18 at a space 62 adjacent the vertical detent 68. The horizontal detent 72 of the adapter fitting 18 is abuttable with the horizontal detent 74 of the door fitting 16. As shown, the door fitting 16 and the adapter fitting 18 are directly engageable in an interlocking arrangement, through abutment of their respective vertical and horizontal detents. Such a configuration can prevent vertical and horizontal movement of the door 12 when fitted to the adapter frame 20.

In the embodiment shown, the vertical detents 60, 68 and spaces 64, 62 of the door and adapter fittings 16, 18 resemble an alternating tooth and tooth receiver structure. That is, the vertical detents 60, 68 and spaces 64, 62 resemble respective teeth and teeth receivers. As shown, respective teeth (e.g. 60) of the door fitting 16 are configured to fit with respective tooth receivers (e.g. 62) of the adapter fitting 18. Likewise, respective teeth (e.g. 68) of the adapter fitting 18 are configured to fit with respective teeth receiver (e.g. 64) of the door fitting 16. Thus, the interlocking arrangement can be achieved by the fitting of the respective alternating tooth and tooth receiver structures of the door and adapter fittings 16, 18.

In some embodiments, at least one of the vertical detent 68 for the adapter fitting 18 and the vertical detent 60 for the door fitting 16 includes a ramp surface 76. The ramp surface 76 can facilitate installation and/or assembly by boosting the ability to fit the door 12 and the adapter frame 18. In the embodiment shown, the ramp surface 76 is at a junction of a lead side surface and one or both of a top surface and bottom surface of the vertical detent 68 of the adapter fitting 18. It also will be appreciated that the ramp surface 76 may be at a junction of the lead side surface and bottom surface of the vertical detent 68. Likewise, the horizontal detent 74 of the door fitting includes a ramp surface 66 in some embodiments. As shown, the ramp surface 66 is at a junction of a lead side surface and one or both of right and left side surfaces of the horizontal detent 74.

As also shown, the horizontal detents 72, 74 can have radiused or curved side surfaces in a vertical direction toward the top and bottom surfaces of the vertical detents 60, 68. These surfaces can also help the key structure of the fittings 16, 18.

Figure 6:
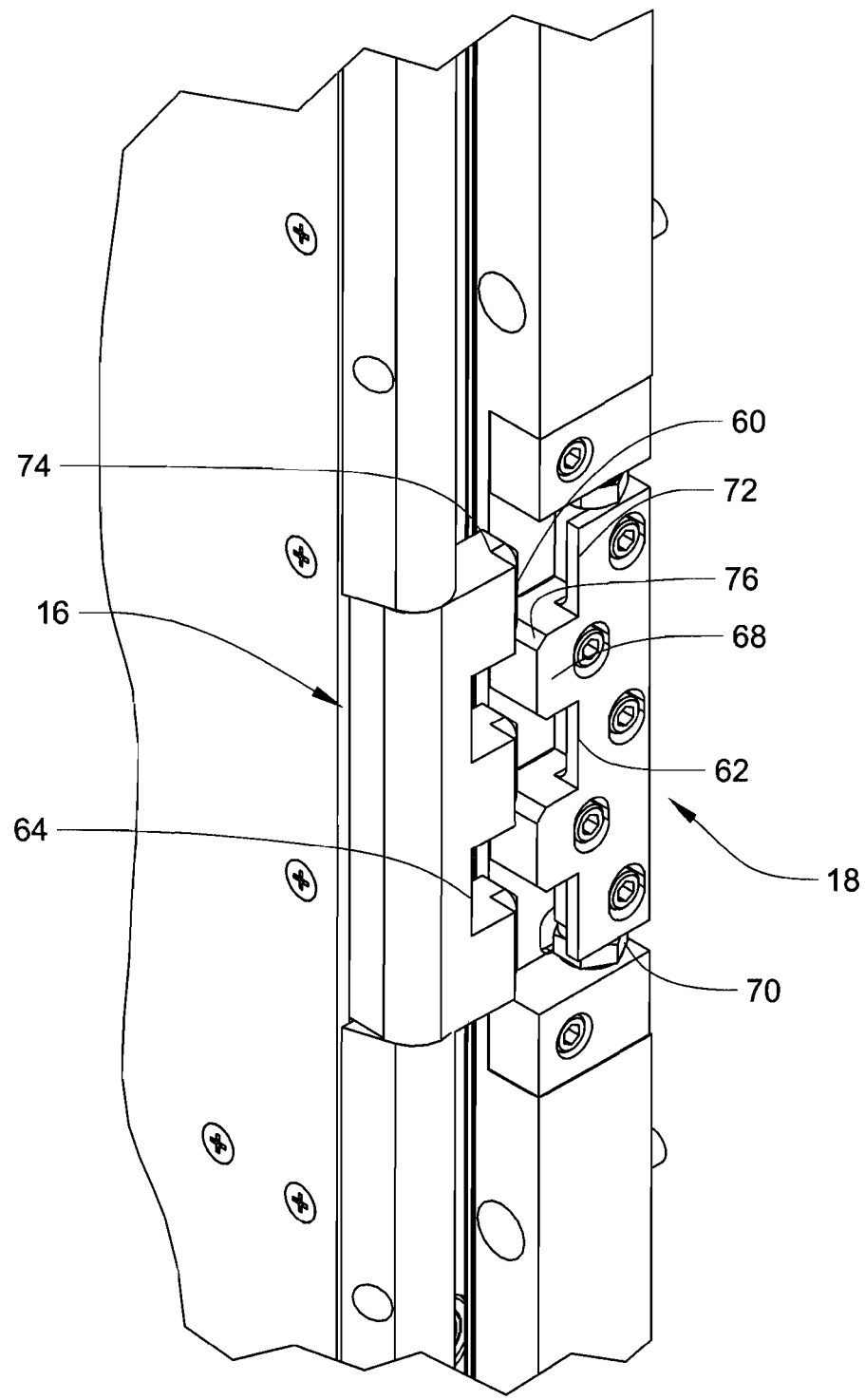
FIG. 6 shows a close up perspective view of one embodiment of an interlocking key set of the door assembly of FIG. 1 before connection.
Figure 6A:
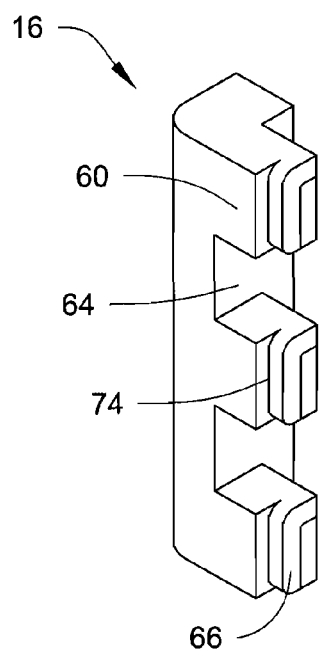
FIGS. 6A and 6B show a view of one fitting for the door side shown in FIG. 6.
Figure 6B:
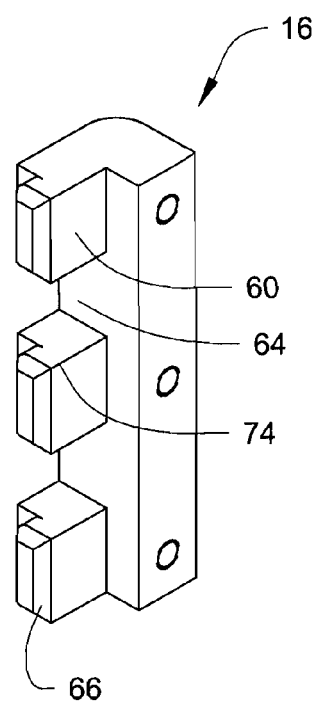
Figure 6C:
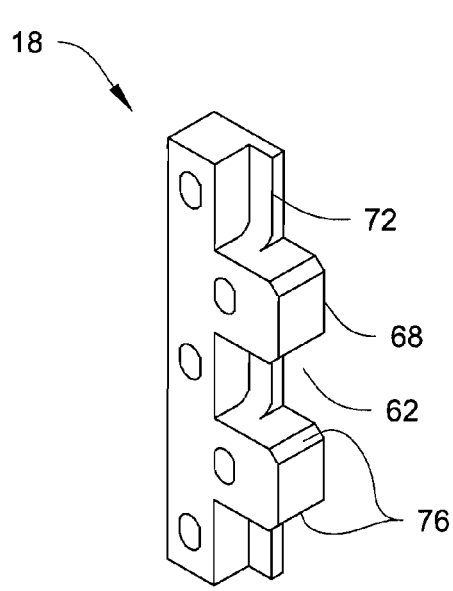
FIGS. 6C and 6D is a view of another fitting for the cabinet side shown in FIG. 6.
Figure 6D:
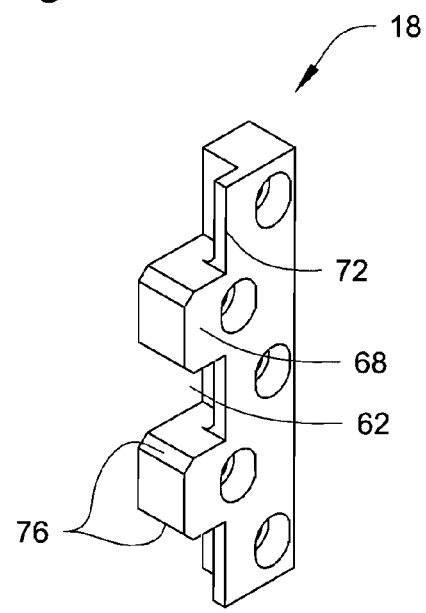
Figure 7A:
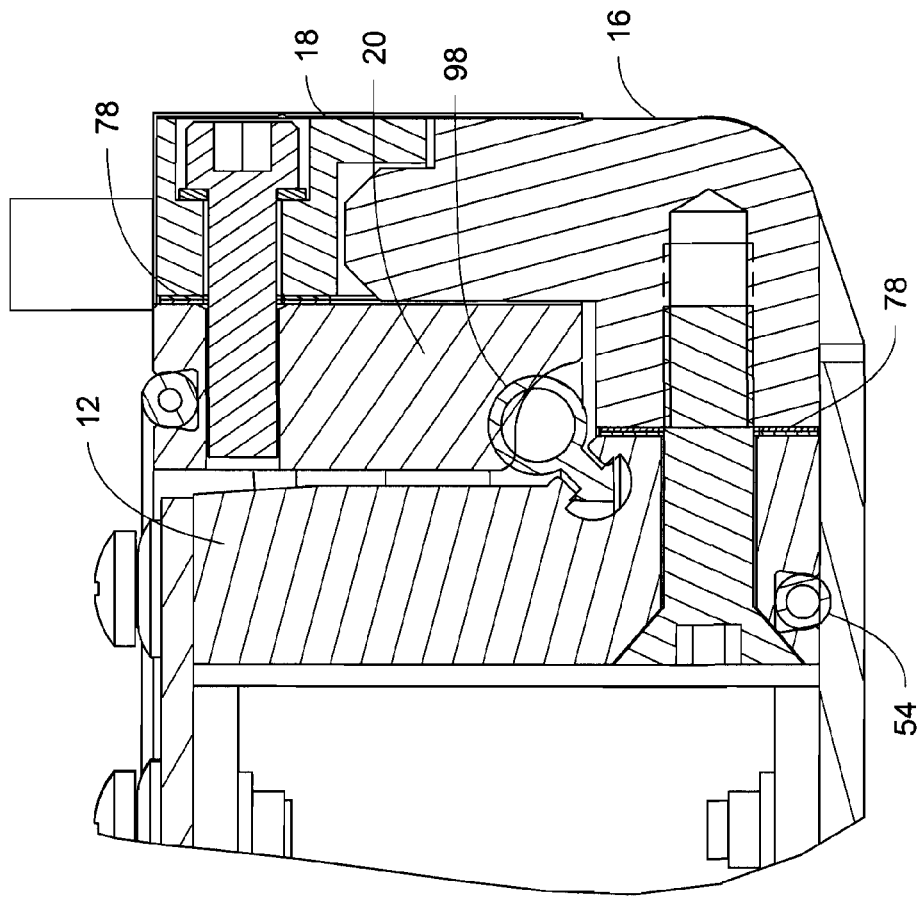
FIG. 7A shows a sectional view of the interlocking key set of FIG. 7.
Figure 7:
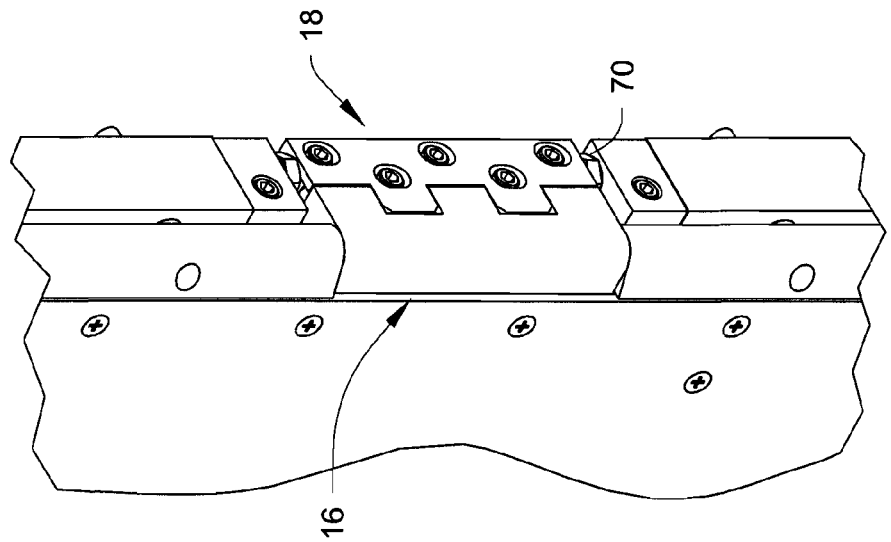
FIG. 7 shows another close up perspective view of the interlocking key set of FIG. 6 when connected.
Figure 8:
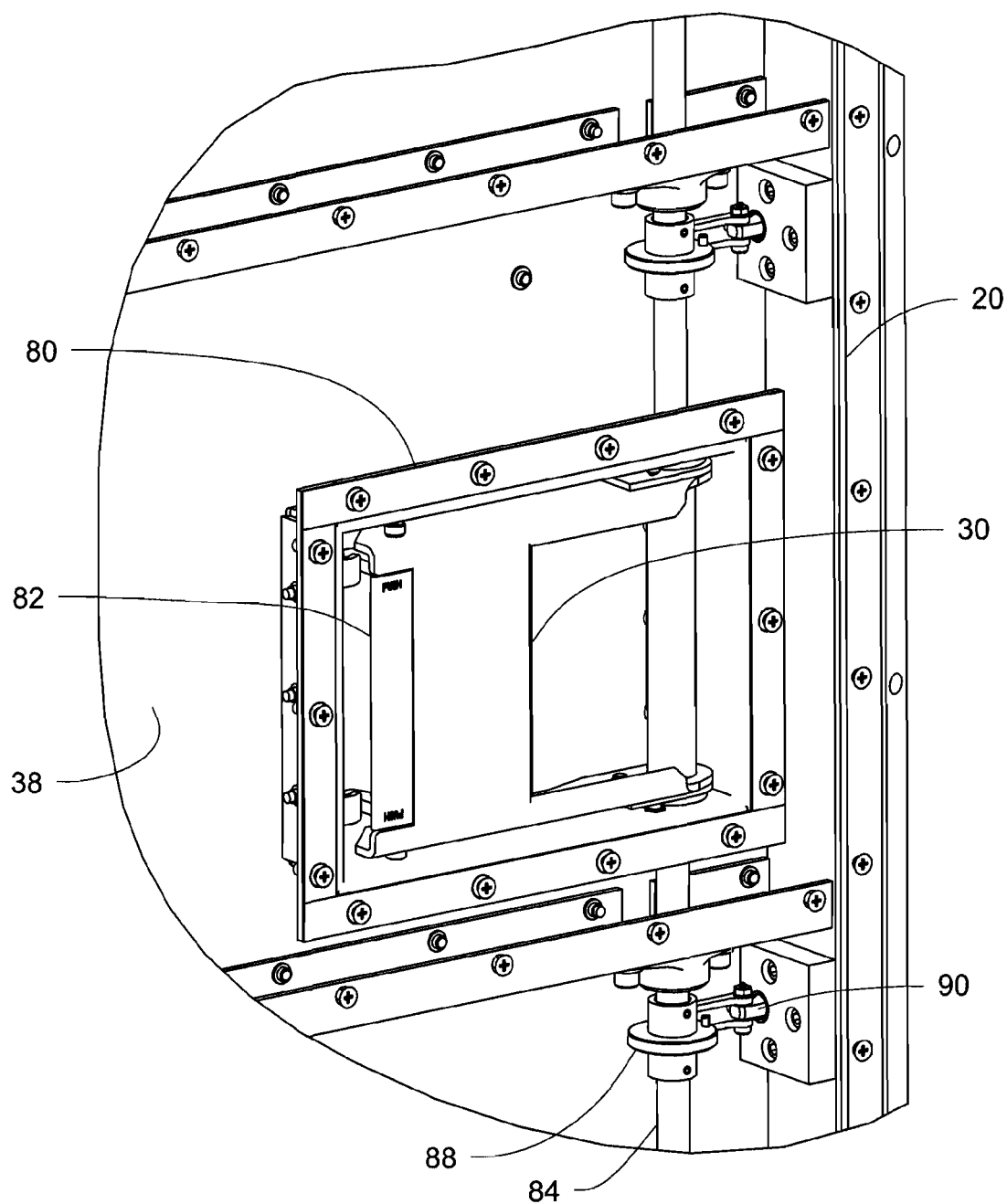
FIG. 8 shows a perspective view of one embodiment of a single latch handle for the door assembly of FIG. 1 in a lock position and showing locking bolts on the door engaged into bolt receiving bushings.
Figure 9:
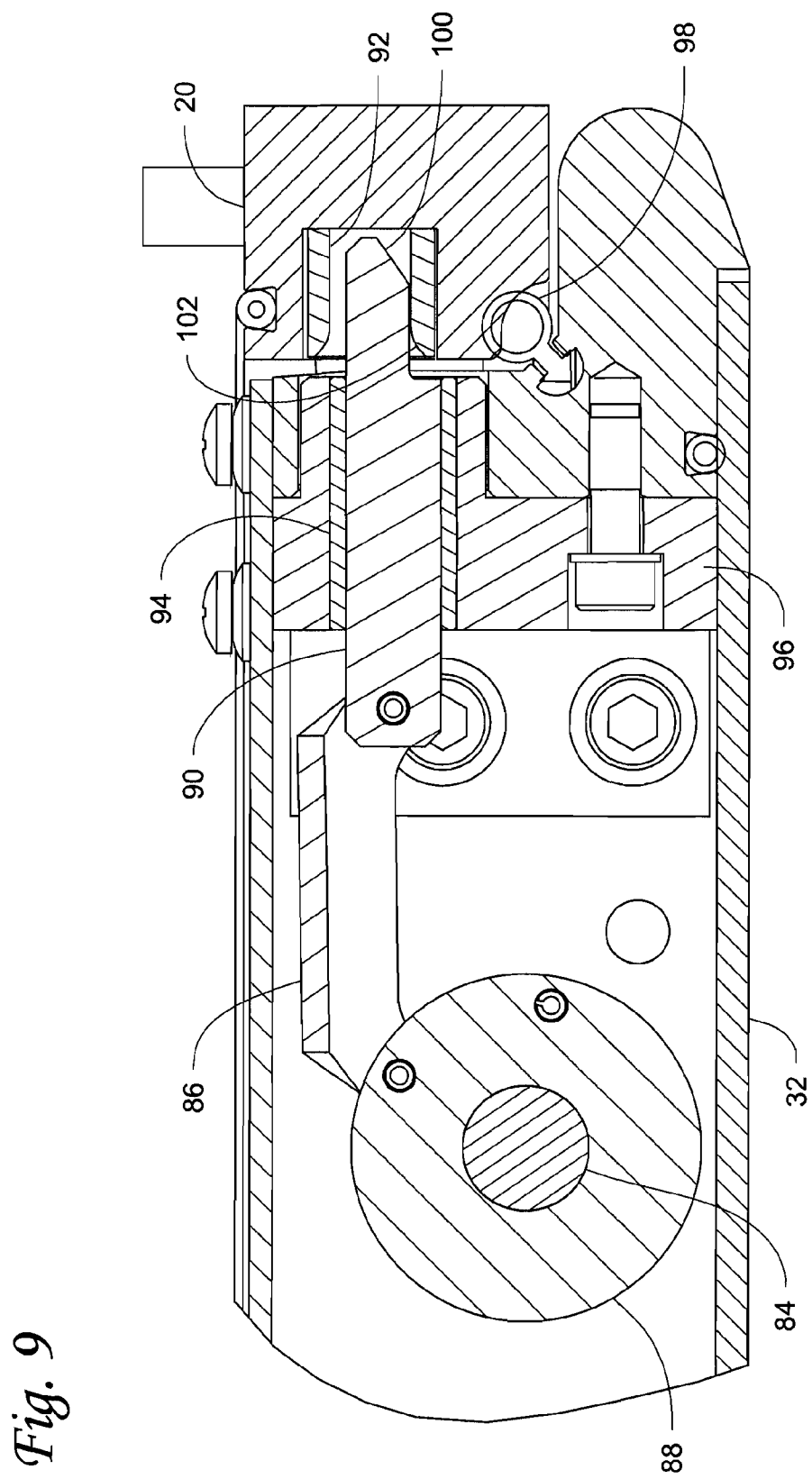
FIG. 9 shows a sectional view of one embodiment of the inner structure of the single latch handle of FIG. 8 in the lock position.
Figure 10:
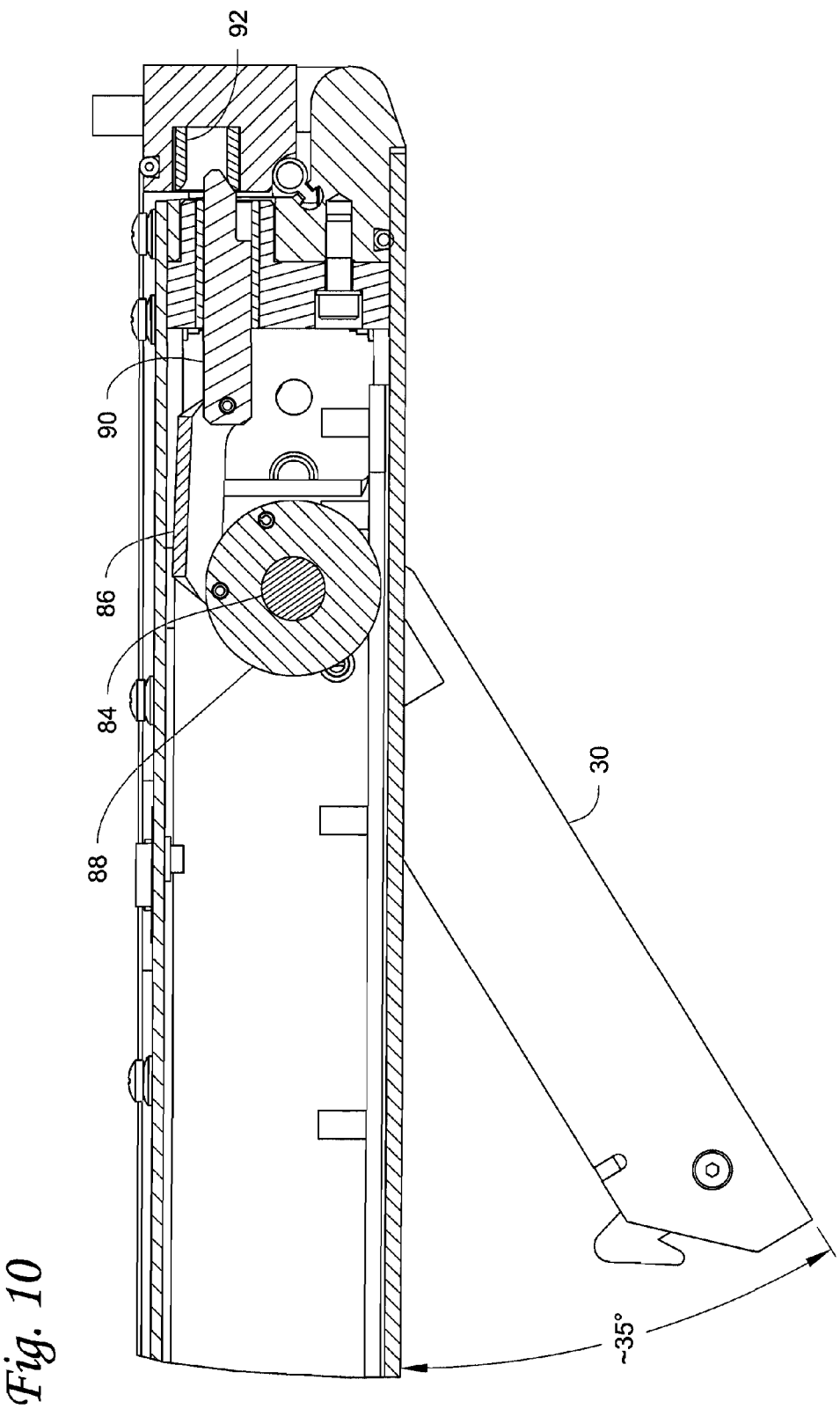
FIG. 10 shows a sectional view of the single latch handle of FIG. 8 moved toward the unlock position.
Figure 11:
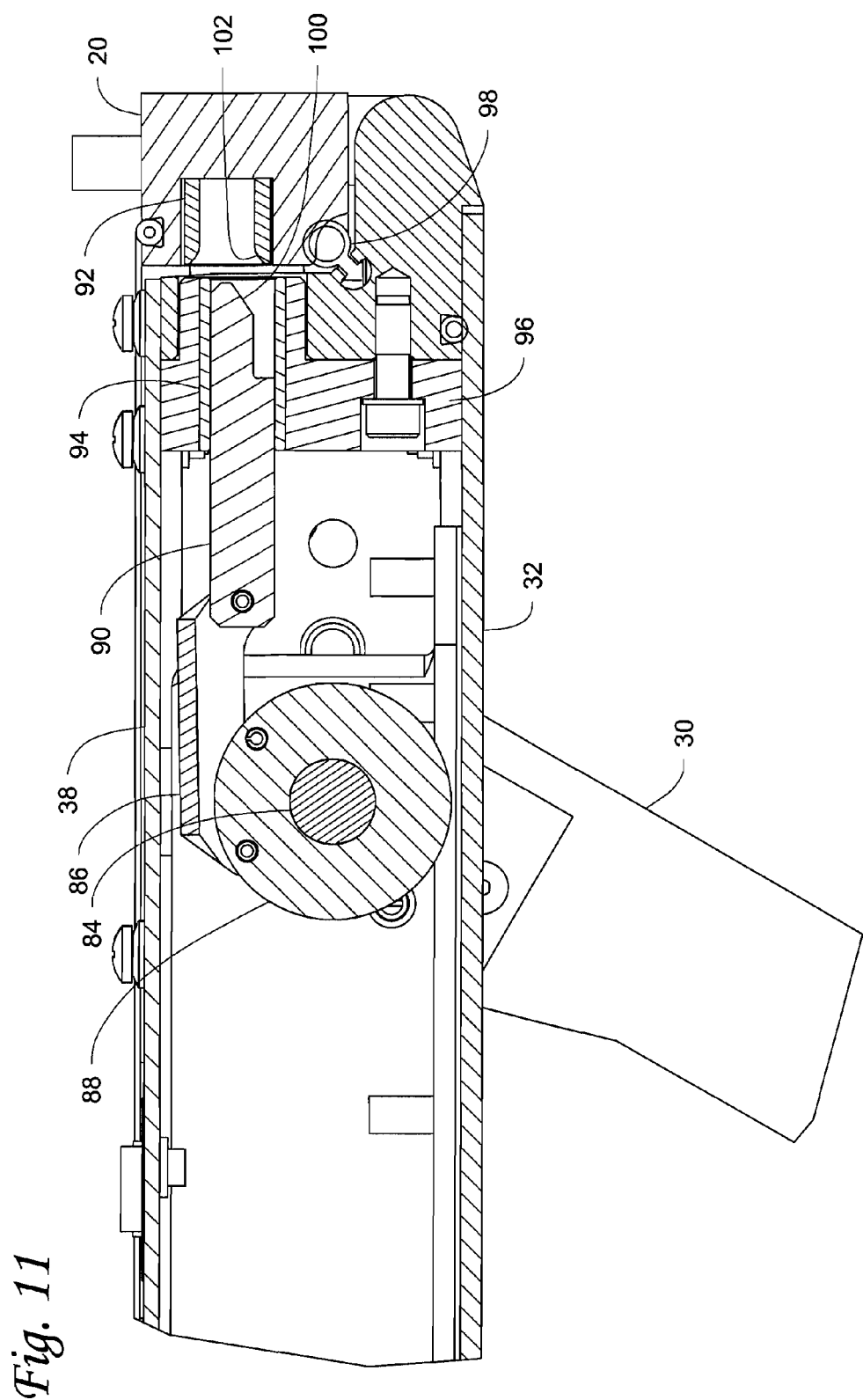
FIG. 11 shows another sectional view of the single latch handle of FIG. 8 moved into the unlock position.
Figure 12:
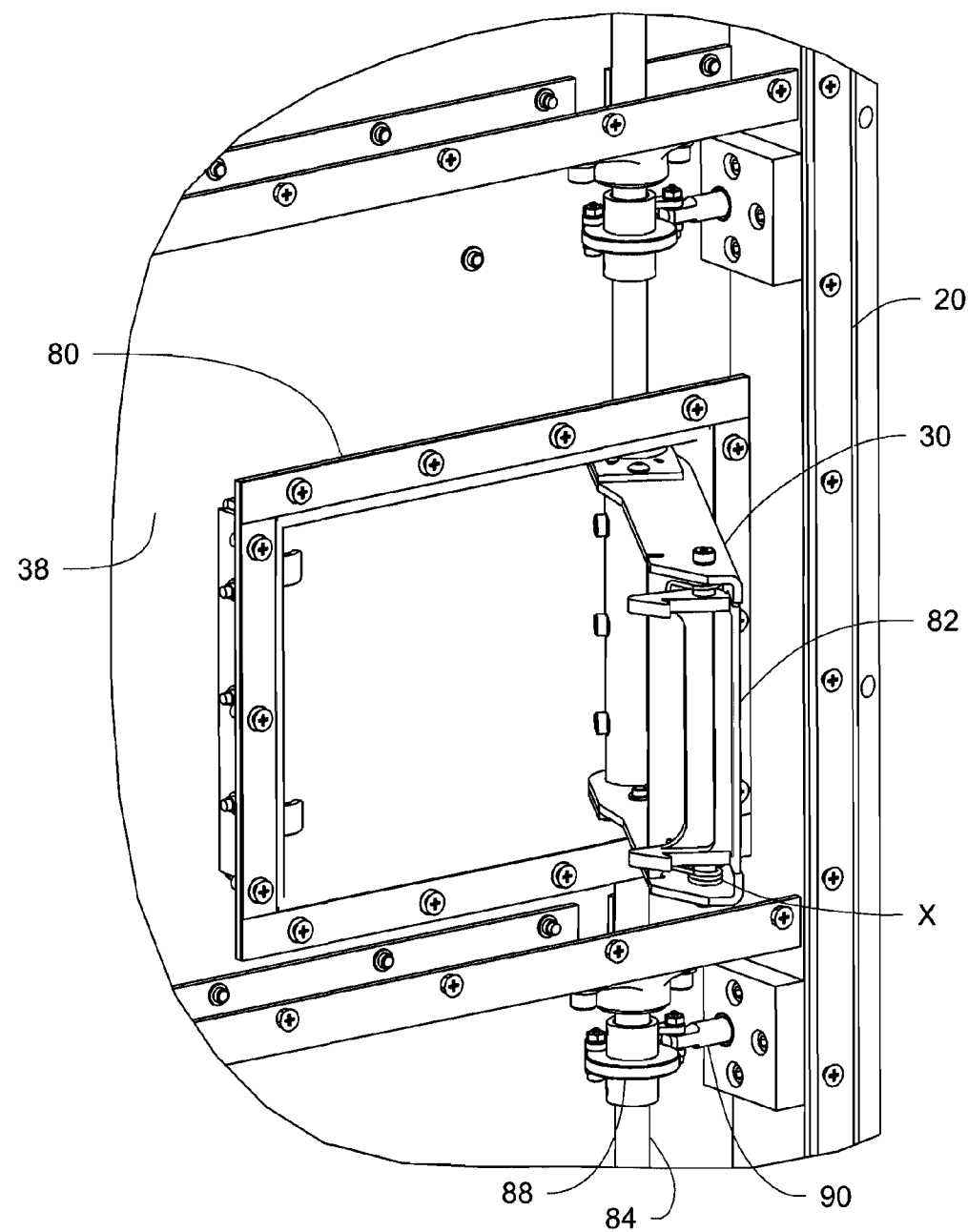
FIG. 12 shows a perspective view of the single latch handle in the unlock position and showing the locking bolts on the door removed from the bolt receiving bushings.

With further reference to the horizontal detents 72, 74, these detents in some examples, such as in FIGS. 6 and 7, generally are constructed as horizontally facing step portions. That is, the horizontal detent 74 of the door fitting is horizontally facing step portion that is abuttable with the step portion of the horizontal detent 72 of the adapter fitting 18. The abutment of the step portions can prevent horizontal movement of the door 12 relative to the adapter frame 20 when they are fitted together.

With reference to adjustment of the fittings 16, 18, FIGS. 6 and 7 show locking screws 70 that may help vertical adjustment of the fittings during, for example installation and/or assembly. The locking screws 70 can prevent the unwanted movement of the keyset 18 from vibration and shock after being adjusted and aligned. The locking screws 70 also can be rotated to move the fittings 16, 18 into better engagement. The locking screws 70 allow for vertical adjustment, alignment, and general fine-tuning of the fitting 18 during assembly. In the embodiment shown, the locking screw 70 is part of the connected fitting 18 and connected to the adapter frame 20.

In some embodiments, the side-to-side position of the hinges and interlocking key sets is adjustable. For example, some embodiments include shims 58, 78 (see e.g. FIGS. 5 and 7A) as part of either or both of the hinges 14 and fittings 16, 18 that can be removed or replaced. As shown for example, the shims 58, 78 can be disposed between any of the cabinet-side hinge part 44, the door-side hinge part 46, and/or either of fittings 16, 18 and the adapter frame 20 and/or door 12. The shims 58, 78 can help accommodate variations due to manufacturing tolerances, while helping to achieve the tight fit.

With regard to the tolerances between the fitting detents, it will be appreciated that a tight fitting engagement between the door 12 and the adapter frame 20 can be achieved by using tight tolerances or nominal clearance between the fittings. For example, the tolerance between respective detents may be about a few sheets of paper, so as to allow the fittings 16, 18 to be assembled.

In assembly, the structural integrity of the cabinet 120 and door 12 can be maintained by the robust and rigid hinges 14 and interlocking detents of the fittings 16, 18. For ease of description, the hinges and detent fittings 16, 18 have been discussed with respect to the adapter frame 20. However, it will be appreciated that the hinges 14 and fittings 16, 18 may be directly attached to the cabinet 120, so as not to require mounting with an adapter frame. For example, in new builds of a cabinet already constructed for use with the door described herein, and that do not require an adapter frame (e.g. adapter frame 20).

In some embodiments, the hinges 14 and fittings 16, 18 may be constructed of stainless steel. As shown, four sets of hinges 14 and four sets fittings 16, 18 are provided. The particular number of hinges and fittings is not meant to be limiting and it will be appreciated that their number can be modified as needed for the size and type of enclosure that a door herein is to be implemented with. As described above, it further will be appreciated that the door assembly may include fittings or keysets disposed at other locations or edges of the door assembly, such as on top and bottom edges of the door assembly.

With reference to the actuatable lock mechanism, FIGS. 8-12 show one embodiment of an actuatable lock mechanism that uses a one-handed single latch handle 30. The handle 30 is secured by a latch 82, which can be thumb-activated. In one embodiment, the latch 82 is designed with its center of mass co-axial with its center of rotation and whose position is maintained by the force of a spring X so that it does not swing or fly open unless actively moved, so as to prevent the latch from opening during a high stress event, such as during shock and vibration.

As shown, the handle 30 is supported on the door 12 by a frame 80. The frame 80 can be mounted on the door 12, for example, by bolting it on one or more panels and/or other frame structures of the door 12. The handle 30 is movable with respect to the door 12, and is operatively connected to a locking bolt 90. In the embodiment shown, the handle 30 resembles a crank-like mechanism for locking/unlocking the bolt 90 which is a slider-like locking bolt. The locking bolt 90 is movable to put the door 12 in the lock and unlock positions, depending on how handle 30 is moved.

As shown, the handle 30 has a frame that has a raised sheet metal lip to help reduce or eliminate the potential for operator pinching. Further, the latch 82 can have a gap size fit relative to the handle support 80.

With further reference to the locking features controlled by the handle 30, the locking bolt 90 is part of a lock bolt assembly connected and cooperating with the handle 30. As shown, the locking bolt 90, which may be of hardened steel, is supported on a shaft 84 rotatable with the handle 30 through support collar 88. The support collar 88 also is connected to a locking bolt support 86, which connects the locking bolt 90. As shown, the locking bolt 90 is insertable and removable from a bolt receiver 92 on the adapter frame 20. The locking bolt 90 is movable through activation of the handle 30 to rotate the shaft 84 and push/pull the locking bolt 90 through the lock bolt support 86.

By movement of the handle 30 a pull or push action is imparted on the locking bolt 90 so it moves into and out of the bolt receiver 92. FIGS. 8-12 show the various lock and unlock stages of the handle 30 and the lock assembly.

In some embodiments, a bushing support 96 supports a bushing 94 that allows the locking bolt 90 to slide with relative ease. The bushing 94 can be a lubricated bronze material or coated material.

It will be appreciated that the mechanical connections described are not to be limiting to the particular implementation illustrated, and that the lock assembly may be accomplished in any number of ways as known and may be accomplished by one of skill in the art. Further, it will be appreciated that all components may be replaceable as needed, for example, over time and wear and tear. As shown, the handle 30 locks and unlocks multiple locking bolts 90 (see e.g. FIGS. 8 and 12) that are received by the adapter frame 20. It will be appreciated that one locking bolt 90 may be sufficient depending on the type of cabinet and door assembly used.

In some embodiments, locking bolt 90 may have a lead ramped surface 100 that can engage of ramp surface 102 of the bolt receiver 92 to help facilitate locking. The ramp surfaces 100, 102 can help boost the engagement to allow the lock to enter and exit the bolt receiver 92.

With further reference to the operation of actuatable locking mechanism, the handle 30 and locking structures help to draw the door 12 against and compress against seals 98 between the door 12 and the adapter frame 20. For example, the seals may be constructed as EMI gaskets to complete the seal between the door 12 and adapter frame 20. As with the EMI seals above, such seals may constructed as hollow compression seals (e.g. manufactured by Vanguard).

In one embodiment, the handle can be pulled about 35 degrees from the door to release the seal 98, but short of releasing the lock bolt. It will be appreciated that angles other than 35 degrees may be suitable to release the seal 98. Pulling the handle further away from the door opens the door.

Figure 13:
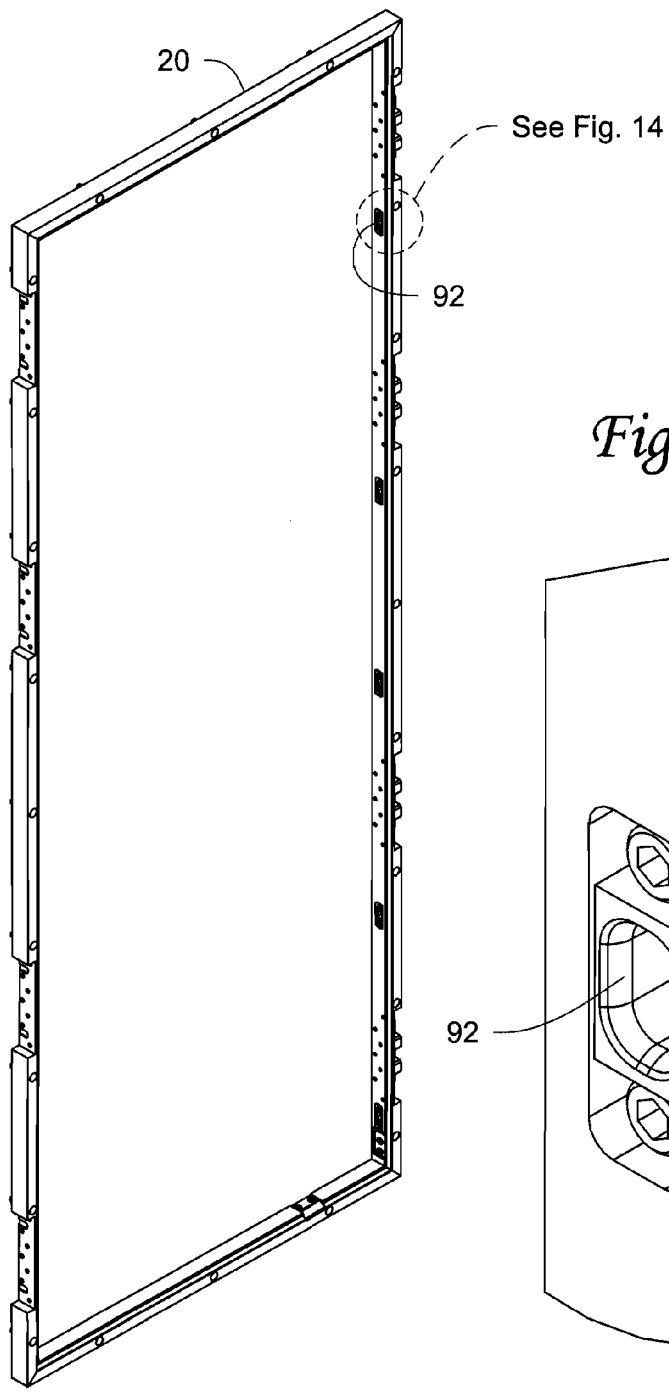
FIG. 13 shows a perspective embodiment of an adapter frame shown in FIG. 1 showing one embodiment of bolt receivers.
Figure 14:
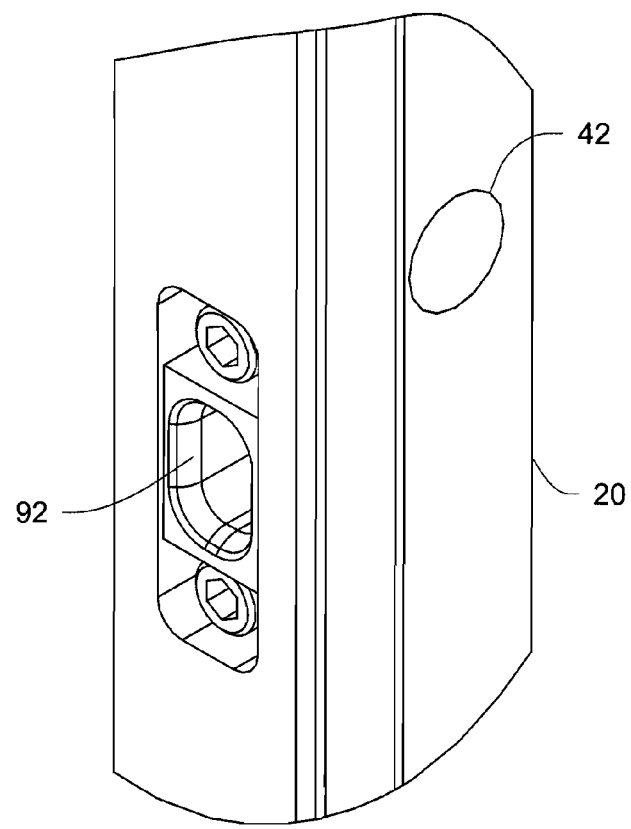
FIG. 14 shows a close up perspective view of the bolt receivers shown in FIG. 13.

With further reference to the bolt receiver 92, FIGS. 13 and 14 show the bolt receiver 92 in a side of the adapter frame 20. As described, the bolt receiver 92 receives the locking bolt 90 to lock the door 12 to the adapter frame 20. It will be appreciated that there will be as many bolt receivers 92 as needed to accommodate the number of locking bolts 90. As shown, the locking bolt and receiver structure is on the right side of the door assembly. The particular location is not meant to be limiting and it will be appreciated that the locking bolt and receiver structure may disposed at other locations or edges of the door assembly, such as on top and bottom edges of the door assembly.

The door concepts herein can meet structural requirements to withstand extreme environmental events and can be actuated by a single latch. The door concepts herein can allow for quick and convenient accessibility to open and close the door, for example in about ten second or even less, while offering an overall ease of assembly.

Among other benefits, time can be saved to open and close such doors (e.g. as opposed to existing 24 bolt doors), while maintaining such structural integrity and requirements (e.g. shock, vibration, drip, temperature), and existing doors can be replaced, if needed, with convenient backfittable features in an efficient and cost effective manner.

The invention may be embodied in other forms without departing from the spirit or novel characteristics thereof. The embodiments disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. A door assembly for a cabinet and being suitable for environments of shock and vibration comprising:
a door;
a door-side hinge connected to a side of the door, the door-side hinge is configured for pivotable attachment directly or indirectly to a cabinet;
a door fitting connected to a fixed position on a side of the door, the door fitting is configured to directly or indirectly fit the door to the cabinet, the door fitting includes at least two vertical detents and at least two receiving spaces, the at least two vertical detents and the at least two receiving spaces are in an alternating arrangement;
another fitting adapted to connect to the door fitting and configured to directly or indirectly connect to the cabinet, the another fitting includes at least two vertical detents and at least two receiving spaces, the at least two vertical detents and the at least two receiving spaces are in an alternating arrangement,
the another fitting is connectable to the door fitting, where the at least two vertical detents of the door fitting and the another fitting are respectively abuttable with surfaces within the at least two receiving spaces of the another fitting and the door fitting, and where the door fitting and the another fitting are directly engageable in an interlocking arrangement through the abutment of their respective vertical detents and surfaces within the receiving spaces, so as to prevent movement of the door when the door is fitted to the cabinet;
the door fitting and the another fitting are abuttable in a direction perpendicular to the axis of rotation of the door-side hinge;
an actuatable lock mechanism that respectively puts the door into lock and unlock positions; and
a locking screw disposed on the another fitting and toward at least one of the top and bottom of the another fitting, the locking screw being rotatable to vertically adjust and to align the another fitting with the door fitting.

2. The door assembly of claim 1, wherein the door comprises outer frame members forming a generally tall rectangle, at least one cross brace between sides of the outer frame members, and outer and inner panels that cover at least the cross brace.

3. The door assembly of claim 1, further comprising an adapter frame constructed and arranged as a perimeter with an inner edge defining a generally open area, the adapter frame having one side constructed and arranged to directly connect to the door, and includes fastener receivers through the adapter frame, the fastener receivers are configured to receive fasteners to directly connect another side of the adapter frame to the cabinet, the another fitting is disposed on the one side of the adapter frame that connects to the door.

4. The door assembly of claim 3, further comprising a cabinet-side hinge connected to a side of the adapter frame that corresponds with the side of the door that the door-side hinge is connected, the cabinet-side hinge is configured for pivotable attachment directly with the door-side hinge.

5. The door assembly of claim 3, wherein the door fitting includes a horizontal detent configured to prevent horizontal movement of the door when the door is fitted to the cabinet.

6. The door assembly of claim 5, wherein the another fitting includes a horizontal detent, the horizontal detent of the another fitting is abuttable with the horizontal detent of the door fitting.

7. The door assembly of claim 6, wherein the horizontal detent of each of the door fitting and the another fitting comprise a horizontally facing step portion, the horizontally facing step portions are abuttable with each other to prevent horizontal movement of the door relative to the adapter frame.

8. The door assembly of claim 1, wherein at least one of the vertical detents of the another fitting and the door fitting includes a ramp surface.

9. The door assembly of claim 1, wherein the actuatable lock mechanism is a one-handed latch handle supported on the door and movable with respect to the door, the one-handed latch handle is operatively connected to a locking bolt, the locking bolt is movable to put the door in the lock and unlock positions, when the one-handed latch handle is moved, and the locking bolt includes a leading portion with a ramp surface.

10. The door assembly of claim 3, wherein the adapter frame includes a bolt receiver in a side of the frame, the bolt receiver includes a ramp surface; and
the actuatable lock mechanism is a one-handed latch handle supported on the door and movable with respect to the door, the one-handed latch handle is operatively connected to a locking bolt, the locking bolt is movable into and out of the bolt receiver to place the door into the lock and unlock positions, when the one-handed latch handle is moved, and the locking bolt includes a leading portion with a ramp surface that is engageable with the ramp surface of the bolt receiver during locking and unlocking of the door from the adapter frame.

11. The door assembly of claim 3, further comprising at least one of an electromagnetic interference seal and a seal that prevents fluid ingress between the door and the adapter frame, and comprising at least one of another electromagnetic interference seal and another seal that prevents fluid ingress on the adapter frame, the another electromagnetic interference seal or another seal configured to directly seal the adapter frame with the cabinet.

12. A door kit for a cabinet and being suitable for environments of shock and vibration comprising:
a door;
a door-side hinge connected to a side of the door;
a door fitting connected to a fixed position on a side of the door, the door fitting includes at least two vertical detents and at least two receiving spaces, the at least two vertical detents and the at least two receiving spaces are in an alternating arrangement;
an actuatable lock mechanism that respectively puts the door into lock and unlock positions;
an adapter frame constructed and arranged as a perimeter with an inner edge defining a generally open area, the adapter frame comprises:
fastener receivers through the adapter frame that are configured to directly connect the adapter frame to the cabinet;
an adapter fitting connected to a fixed position on a side of the adapter frame that corresponds with the side of the door that the door fitting is connected,
the adapter fitting includes at least two vertical detents and at least two receiving spaces, the at least two vertical detents and the at least two receiving spaces are in an alternating arrangement,
the adapter fitting is connectable to the door fitting, where the at least two vertical detents of the door fitting and the adapter fitting are respectively abuttable with surfaces within the at least two receiving spaces of the adapter fitting and the door fitting, and where the door fitting and the adapter fitting are directly engageable in an interlocking arrangement through the abutment of their respective vertical detents and surfaces within the receiving spaces, so as to prevent movement of the door when the door is fitted to the cabinet, the door fitting and the adapter fitting are abuttable in a direction perpendicular to the axis of rotation of the door-side hinge; and a cabinet-side hinge connected to a side of the adapter frame that corresponds with the side of the door that the door-side hinge is connected, the cabinet-side hinge is configured for pivotable attachment directly with the door-side hinge; and a locking screw disposed on at least one of the door fitting and the adapter fitting and toward at least one of a top and bottom thereof, when the locking screw is disposed on the door fitting, the locking screw being rotatable to vertically adjust and to align the door-side hinge with the cabinet-side hinge, and when the locking screw is disposed on the adapter fitting, the locking screw being rotatable to vertically adjust and to align the adapter fitting with the door fitting, the locking screw is adjustable within the adapter fitting at the fixed position on the adapter frame.

13. The door kit of claim 12, wherein the door fitting includes a horizontal detent configure to prevent horizontal movement of the door when the door is fitted to the adapter frame.

14. The door kit of claim 13, wherein the adapter fitting includes a horizontal detent, the horizontal detent of the adapter fitting is abuttable with the horizontal detent of the door fitting.

15. The door assembly of claim 3, further comprising a ball bearing roller and a receiving ramp, the ball bearing roller is on the door and the receiving ramp is on the adapter frame, the ball bearing roller and receiving ramp configured to align the door with the adapter frame.

\* \* \* \* \*